United States Patent
Bartling et al.

(10) Patent No.: US 8,836,399 B2
(45) Date of Patent: *Sep. 16, 2014

(54) POSITIVE EDGE FLIP-FLOP WITH DUAL-PORT SLAVE LATCH

(71) Applicant: Texas Instruments Incorporated, Dallas, TX (US)

(72) Inventors: Steven Bartling, Plano, TX (US); Sudhanshu Khanna, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/759,249

(22) Filed: Feb. 5, 2013

(65) Prior Publication Data

US 2014/0218091 A1 Aug. 7, 2014

(51) Int. Cl.
*H03K 3/289* (2006.01)
*H03K 3/012* (2006.01)

(52) U.S. Cl.
CPC .................................. *H03K 3/012* (2013.01)
USPC ............................ 327/202; 327/199; 327/218

(58) Field of Classification Search
USPC ......... 327/199, 202, 203, 208–212, 215, 218, 327/219
See application file for complete search history.

(56) References Cited

U.S. PATENT DOCUMENTS 7,183,825 B2 * 2/2007 Padhye et al. ................. 327/202
7,652,513 B2 * 1/2010 Rao et al. ...................... 327/203

* cited by examiner

*Primary Examiner* — Long Nguyen
(74) *Attorney, Agent, or Firm* — John R. Pessetto; Frederick J. Telecky, Jr.

(57) ABSTRACT

In an embodiment of the invention, a flip-flop circuit contains a 2-input multiplexer, a master latch, a transfer gate and a slave latch. The scan enable control signals SE and SEN of the multiplexer determine whether data or scan data is input to the master latch. The clock signals CLK and CLKN and retention control signals RET and RETN determine when the master latch is latched. The slave latch is configured to receive the output of the master latch, a second data bit D2, the clock signals CLK and CLN, the retain control signals RET and RETN, the slave control signals SS and SSN. The signals CLK, CLKN, RET, RETN, SS and SSN determine whether the output of the master latch or the second data bit D2 is latched in the slave latch. Control signals RET and RETN determine when data is stored in the slave latch during retention mode.

13 Claims, 6 Drawing Sheets

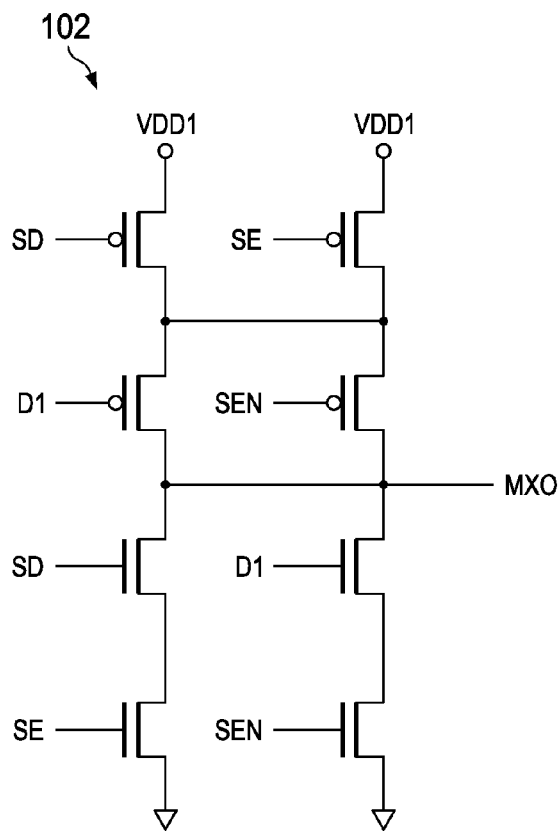
FIG. 2
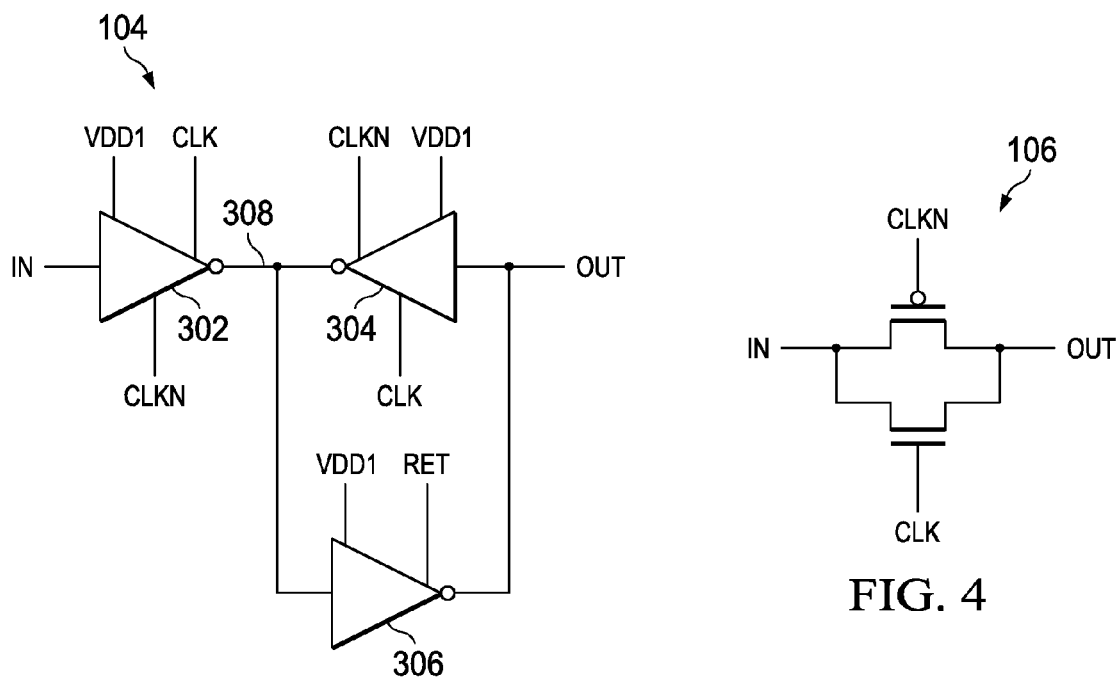
FIG. 3
FIG. 4

US 8,836,399 B2

POSITIVE EDGE FLIP-FLOP WITH DUAL-PORT SLAVE LATCH

BACKGROUND

Several trends presently exist in the semiconductor and electronics industry. Devices are continually being made smaller, faster and requiring less power. One reason for these trends is that more personal devices are being fabricated that are relatively small and portable, thereby relying on a battery as their primary supply. For example, cellular phones, personal computing devices, and personal sound systems are devices that are in great demand in the consumer market. It is also important that data on these devices be retained even when no power is supplied to the electronic device. Non-volatile memory circuits and non-volatile logic circuits are often used to meet these requirements.

Non-volatile logic implementation often requires updating sequential elements, such as flip-flops, from a source external to the sequential element, such as a non-volatile memory. When non-volatile logic circuits are implemented to allow the updating of sequential elements, it is desired that the implementation of the non-volatile logic circuit does not significantly slow the operation of a sequential element.

BRIEF DESCRIPTION OF THE DRAWINGS

FIG. 2 is a schematic diagram of a 2-to-1 multiplexer according to an embodiment of the invention. (Prior Art)

FIG. 3 is a schematic diagram of a master latch according to an embodiment of the invention. (Prior Art)

FIG. 4 is a schematic diagram of transfer gate. (Prior Art)

DETAILED DESCRIPTION

In an embodiment of the invention, a flip-flop circuit contains a 2-input multiplexer, a master latch, a transfer gate and a slave latch. The multiplexer is configured to receive a first data bit D1, a scan data bit SD, a scan enable control signal SE and a binary logical compliment signal SEN of the scan enable control signal SE. The scan enable control signals SE and SEN determine when the data output MXO of the multiplexer is the compliment of data bit D1 or scan data bit SD. The master latch is configured to receive the data output MXO from the multiplexer, a clock signal CLK, a binary logical compliment signal CLKN of the clock signal CLK, a retain control signal RET and the binary logical compliment signal RETN of the retain control signal RET. The signals CLK, CLKN, RET and RETN determine when the binary logical value of the data output MXO from the multiplexer is presented on the output ML0 of the master latch and when the output ML0 of the master latch is latched in the master latch.

A transfer gate transfers data from the output MLO of the master latch to the slave latch when the clock signal CLK transitions from a low logical value to a logical high value. The slave latch is configured to receive the output of the transfer gate, a second data bit D2, the clock signal CLK, the binary logical compliment signal CLKN of the clock signal CLK, the retain control signal RET, the binary logical compliment signal RETN of the retain control signal RET, a slave control signal SS and the binary logical compliment signal SSN of the slave control signal SS. The signals CLK, CLKN, RET, RETN, SS and SSN determine whether the binary logical value of the output of transfer gate or the second data bit (D2) is latched in the slave latch.

Non-volatile logic implementations often require updating sequential elements (e.g. flip-flops) from an external source (e.g. non-volatile memory). In an embodiment of the invention, the slave latch includes a second data input (port). The second data input is used to insert data from an external source. A tri-state inverter is added to the slave latch to accommodate the second data input. This will be explained in more detail later in the specification. When external data needs to be inserted into the slave latch, the tri-state inverter is enabled. During this time, the latch feedback is disabled by causing a forward inverter to be tri-stated with the opposite control signal as the former tri-state inverter.

The added circuitry used to add the second input to the slave latch are not part of the critical timing path of the flip-flop. As a result, change to the regular performance of the flip-flop is negligible.

Figure 1:
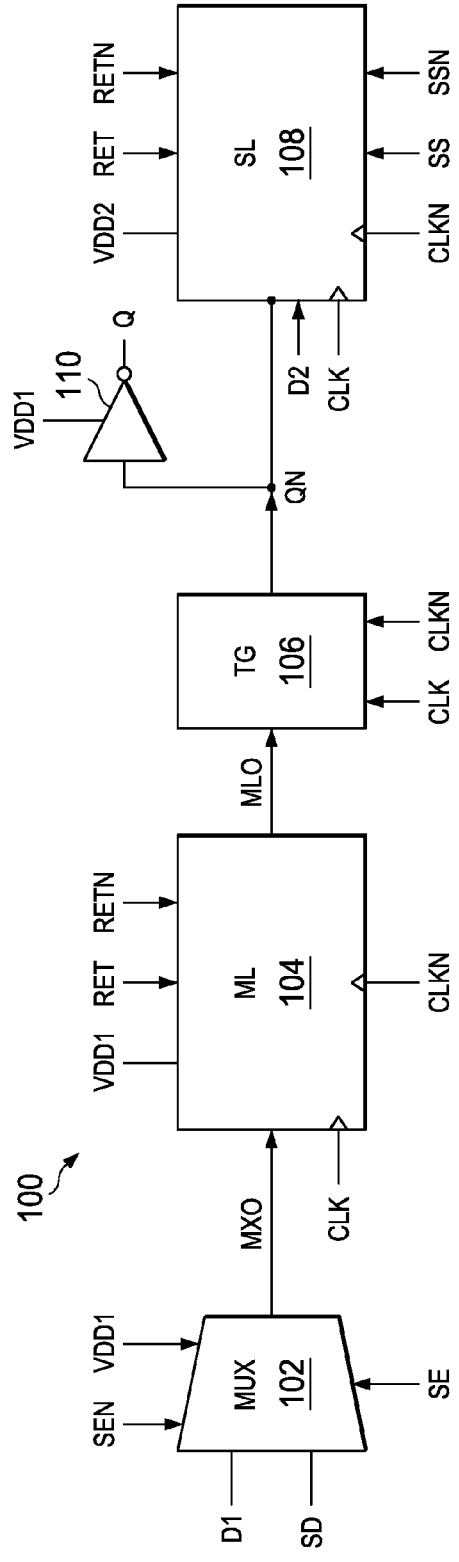
FIG. 1 is a block diagram of a scan-able positive edge flip-flop with a dual-port slave latch according to an embodiment of the invention.

FIG. 1 is a block diagram of a scan-able positive edge flip-flop 100 with a dual-port slave latch 108 according to an embodiment of the invention. In a functional (i.e. normal) mode of operation, the scan enable signal SE is driven to a logical low level and the binary compliment signal SEN of SE is held at a logical high level. Because the flip-flop 100 is being operated in the functional mode, the retention mode signal RET is held at a logical low level, the binary compliment signal RETN of signal RET is held at a logical high level, the slave control signal SS is held at a logical low level, and the binary compliment signal SSN of the slave control signal SS is held a logical high level. Power is need for functional mode operation so power supply VDD1 and power supply VDD2 are applied to the flip-flop 100.

Figure 6:
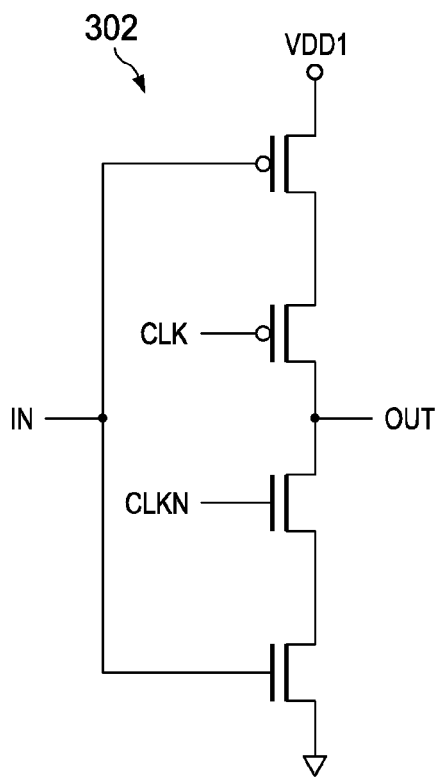
FIG. 6 is a schematic diagram of a clocked inverter according to an embodiment of the invention. (Prior Art)
Figure 7:
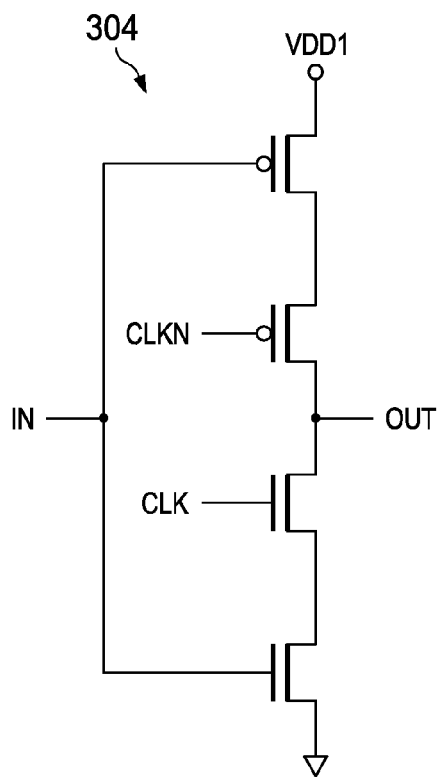
FIG. 7 is a schematic diagram of a clocked inverter according to an embodiment of the invention. (Prior Art)
Figure 8:
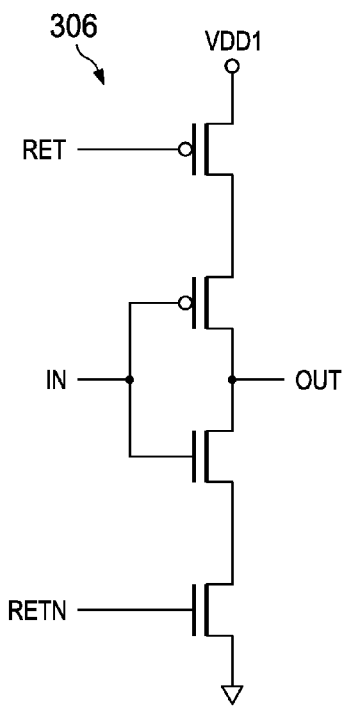
FIG. 8 is a schematic diagram of a tri-state inverter according to an embodiment of the invention. (Prior Art)
Figure 13:
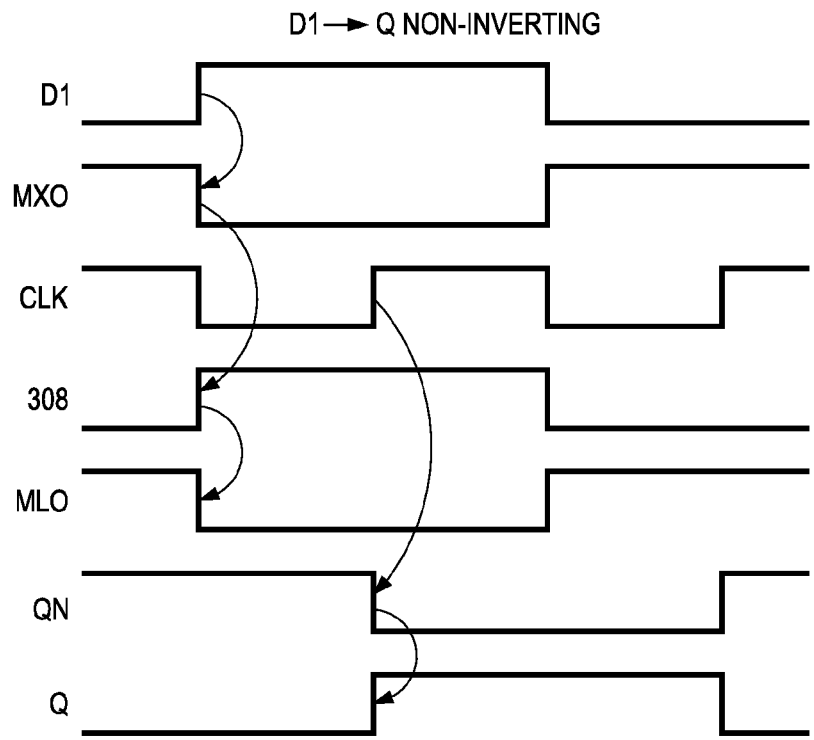
FIG. 13 is a timing diagram showing data bit D1, MXO, clock signal CLK, MLO, QN and the output of the flip-flop Q according to an embodiment of the invention.

FIG. 13 is a timing diagram showing data bit D1, clock signal CLK and the output of the flip-flop Q during the functional mode of operation. The data bit D1 is received at an input of the 2-to-1 multiplexer 102. Because the scan signal SE is low, the binary logical compliment of D1 is passed to the output MXO of the multiplexer. FIG. 2 illustrates an embodiment of a 2-to-1 multiplexer 102. The signal output MXO is then presented to the input IN of the master latch 104. FIG. 3 is a schematic diagram of a master latch 104 according to an embodiment of the invention. The mater latch 104 includes a first clocked inverter 302 (see FIG. 6 for an embodiment of the first clocked inverter 302), a second clocked inverter 304 (see FIG. 7 for an embodiment of the second clocked inverter 304) and a tri-state inverter 306 (see FIG. 8 for an embodiment of the tri-state inverter 306) with tri-state controls RET and RETN.

When the clock signal CLK transitions from a high to a low logical level, the logical compliment of the data on the input IN of the master latch 104 is presented on node 308 of the master latch 104. Because the flop-flop 100 is operating in the functional mode, the tri-state inverter 306 is active and drives the output MLO of the master latch 104 to the same logical value as the input MXO of the master latch 104. When the clock signal CLK transitions from the low logical level to a high logical level (i.e. positive edge of CLK), the logical level on node 308 is latched and the logical level on the output MLO of the master latch 104 is transferred by the transfer gate 106 to QN. Inverter 110 passes the complement of the output MLO of the master latch to the output Q. In this embodiment of the invention, the overall signal path from the input D1 of the multiplexor 102 to the Q output of inverter 110 in the slave latch 108 is non-inverting. However, in other embodiments, the overall signal path can be inverting.

FIG. 4 is a schematic diagram of an embodiment of a transfer gate.

Figure 5:
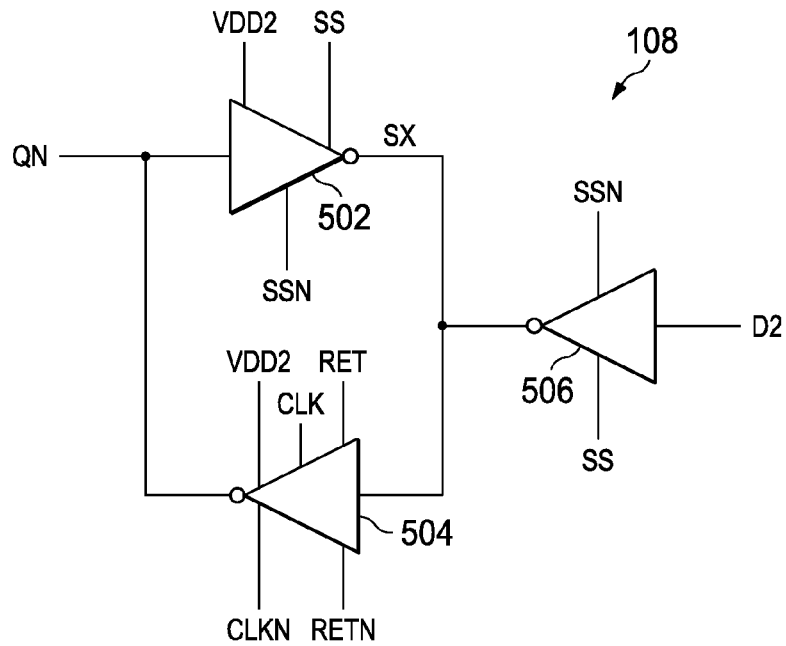
FIG. 5 is a schematic diagram of a dual-port slave latch according to an embodiment of the invention.
Figure 9:
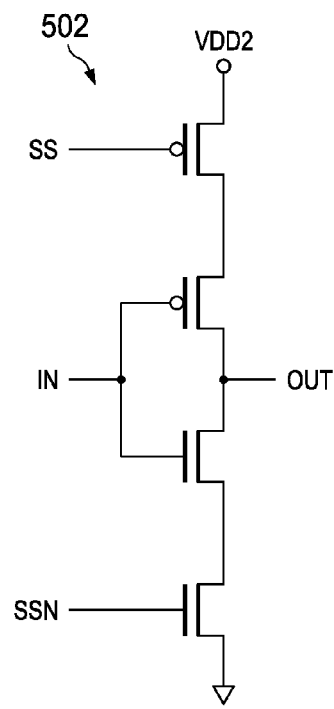
FIG. 9 is a schematic diagram of a tri-state inverter according to an embodiment of the invention. (Prior Art)
Figure 10:
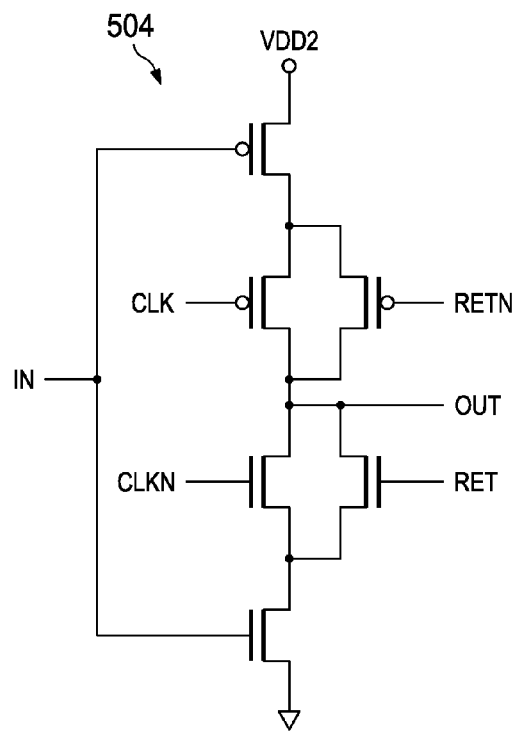
FIG. 10 is a schematic diagram of a clocked inverter according to an embodiment of the invention. (Prior Art)
Figure 11:
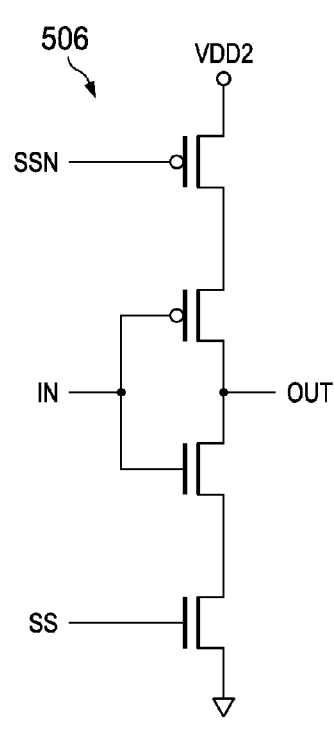
FIG. 11 is a schematic diagram of a tri-state inverter according to an embodiment of the invention. (Prior Art)

FIG. 5 is a schematic diagram of a dual-port slave latch 108 according to an embodiment of the invention. The slave latch 108 includes a first tri-state inverter 502 (see FIG. 9 for an embodiment of the first tri-state inverter 502) with tri-state controls SS and SSN, a clocked inverter 504 (see FIG. 10 for an embodiment of the clocked inverter 504) with controls RET and RETN and a second tri-state inverter 506 (see FIG. 11 for an embodiment of the second tri-state inverter 506) with tri-state controls SS and SSN.

Because the flop-flop 100 is operating in the functional mode, the tri-state inverter 502 is active and drives node SX of the slave latch 108 to the complimentary logical value as the QN of the slave latch 108. When the clock signal CLK transitions from a high logical level to a low logical level, the logical level on the QN is latched by the clocked inverter 504. In this embodiment of the invention, an inverter 110 is used to buffer the QN of the slave latch 108. However, non-inverting buffers may be used as well. The tri-state inverter 506 is tri-stated in this mode because SS is a logical low level and SSN is a logical high level. As a result, D2 is not transferred to node SX.

Figure 15:
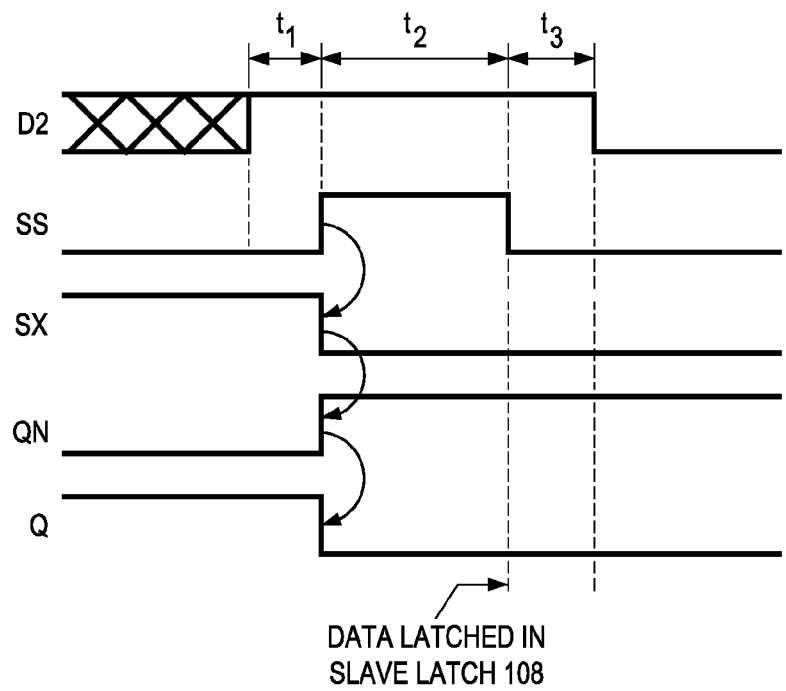
FIG. 15 is a timing diagram showing signals D2, SS, SX, QN, and Q according to an embodiment of the invention.

However, during another functional mode of operation, data D2 may be written directly to the slave latch 108 (See FIG. 15). During this functional mode, scan enable signal SE is held at a logical low level and the binary compliment signal SEN of SE is held at a logical high level. Also during this functional mode, the retention mode signal RET is held at a logical low level and the binary compliment signal RETN of signal RET is held at a logical high level. Likewise, the clock signal CLK is held at a low logical level and CLKN is held a high logical level during this functional mode.

When control signal SS is held at a logical high level and control signal SSN is held at logical low level, tri-state inverter 506 is able to drive the complimentary value of D2 onto node SX of the slave latch 108. Because CLK and RET are held at logical low levels and CLKN and RETN are held at logical high levels, the clocked inverter 504 is active and drives node QN to the logical value of D2. The inverter 110 then inverts the logical value on node QN to its compliment. In this example, the compliment of D2 is presented on node Q. Data signal D2 must be held for the period t3 to insure that the correct value of D2 is latched. Also, control signal SS must remain at logical high value for time t2 to insure that the correct value D2 is latched.

When control signal SS is driven from a logical high level to a logical low level and SSN is driven from a logical low level to a logical high level, the tri-state inverter 506 is tri-stated and tri-state inverter 502 becomes active latching the logical value on node QN of the slave latch 108.

In a scan (i.e. test) mode of operation, the scan enable signal SE is driven to a high logical level and the binary compliment signal SEN of SE is held a logical low level. Because the flip-flop 100 is being operated in the scan mode, the retention mode signal RET is held at a logical low level, the binary compliment signal RETN of signal RET is held at a logical high level, the slave control signal SS is held at a logical low level, and the binary compliment signal SSN of the slave control signal is held a logical high level. Power is needed for functional scan operation so power supply VDD1 and power supply VDD2 are applied to the flip-flop 100.

Figure 14:
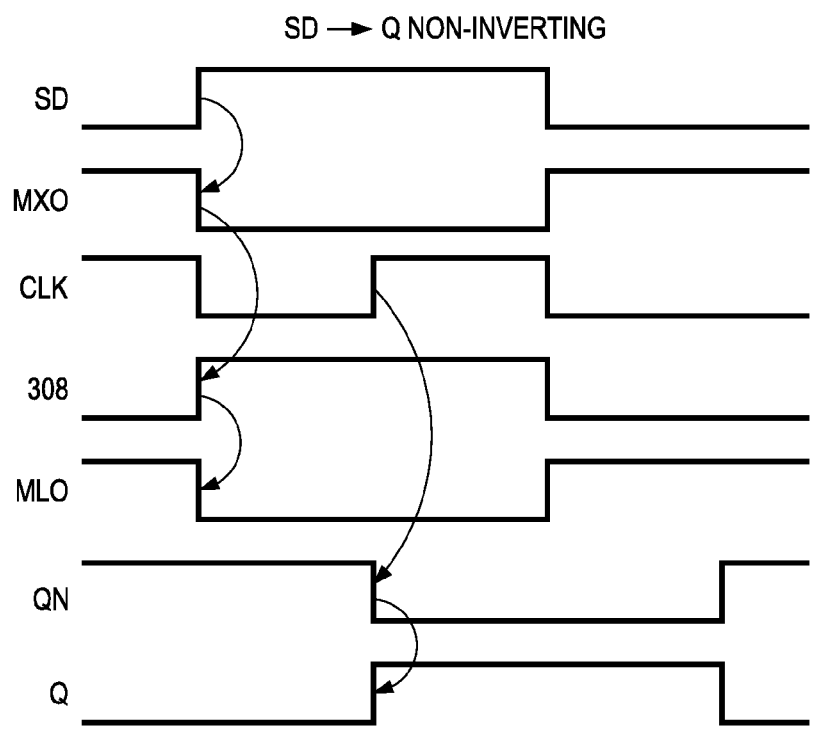
FIG. 14 is a timing diagram showing scan data bit SD, MXO, clock signal CLK, MLO, QN and the output of the flip-flop Q according to an embodiment of the invention.

FIG. 14 is a timing diagram showing scan data bit SD, clock signal CLK and the output Q of the flip-flop 100 during a scan mode of operation. The scan data bit SD is received at an input of the 2-to-1 multiplexer 102. Because the scan signal SE is high, the binary logical compliment of SD is passed to the output MXO of the multiplexer. When in the scan mode, the master latch 104, the transfer gate 106 and the slave latch 108 latch operate in the same manner as they did during the functional mode as previously described.

The flip-flop 100 can also be operated to retain data (RET mode) in the slave latch 108 (power supply VDD2 is active) while the 2-to-1 multiplexer 102, the master slave 104 and the inverter 110 are powered off (i.e. power supply VDD1 is inactivated). In RET mode of operation, the value of the scan enable signals SE and SEN don't matter. Because the flip-flop 100 is being operated in the RET mode, the retention mode signal RET is held at a logical high level and the binary compliment signal RETN of signal RET is held at a logical low level. In this embodiment, the slave control signal SS is held at a logical low level, and the binary compliment signal SSN of the slave control signal is held at a logical high level. The value of the clock signals CLK and CLKN don't matter. As stated earlier, power is only applied to the slave latch 108 by power supply VDD2.

Because power is not supplied to the 2-to-1 multiplexer 102 and the master latch 104, the data presented to the input IN of the transfer gate 106 is guaranteed not to have a path to VDD or ground (VSS) via the RET and RETN functionality embodied in the tri-state inverter 306 in the master latch 104. In this manner, the data being retained in the slave latch 108 will not be inadvertently corrupted by the indeterminate value of the input to the tri-state inverter 308 (the input is indeterminate as the supply VDD1 is inactive or floating).

Because the flop-flop 100 is operating in the retention mode, the tri-state inverter 502 is active and drives node SX of the slave latch 108 to the complimentary logical value of the value stored on QN of the slave latch 108. Because RET is a logical high value and RETN is a logical low value, the clocked inverter 504 latches the logical value on QN. The tri-state inverter 506 is tri-stated in this mode because SS is a logical low level and SSN is a logical high level. As a result, the logical value on D2 is not transferred to node SX.

Figure 16:
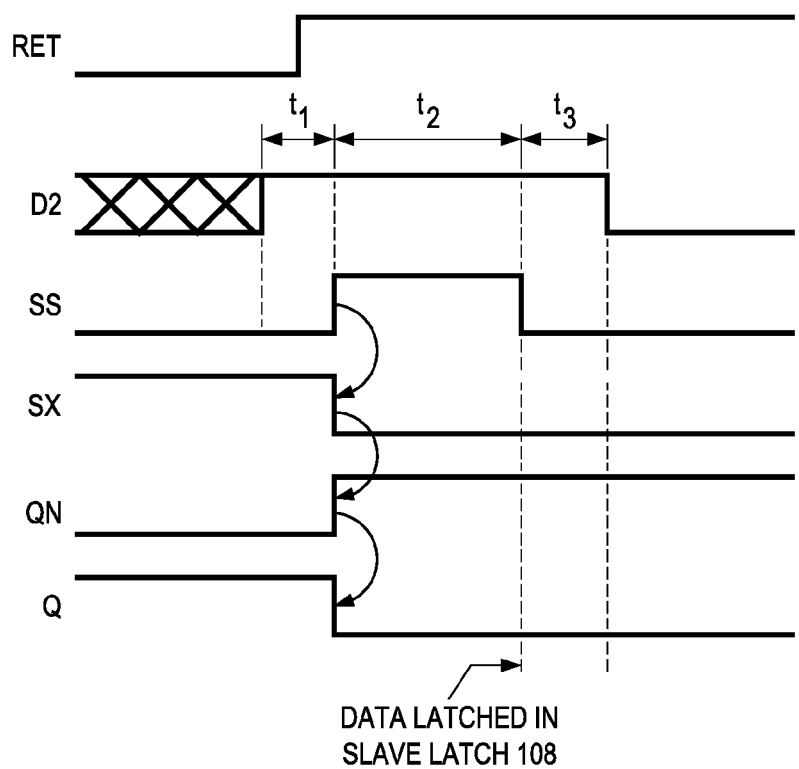
FIG. 16 is a timing diagram showing signals RET, D2, SS, SX, QN, and Q according to an embodiment of the invention.

However, during another retention mode of operation, data D2 may be written directly to the slave latch 108. During this retention mode, the slave control signal SS is driven to a logical high level following RET being driven to a logical high value (see FIG. 16). The clock signals CLK and CLKN and the scan enable signals SE and SEN are don't cares in this mode of operation in this embodiment. D2 must be driven to a logical one or a logical zero some time t1 before the control signal SS transitions from a logical zero to a logical one. Before this time t1, D2 may be a logical one, a logical zero, floating or tri-stated.

Because the slave control signal SS is driven to a logical high level following RET being driving to a logical high value, the tri-state inverter 502 is tri-stated and does not drive node SX of the slave latch 108. Because the slave control signal SS is driven to a logical high and slave control signal SSN is driven to a logical low value, the tri-state inverter 506 is active and drives node SX to the complimentary value presented on D2. Because RET is a logical high value and RETN is a logical low value, the clocked inverter 504 is active and drives node QN. When the slave control signal SS returns to a logic low level and SSN returns to a logic high level, the value stored on node QN is latched between tri-state inverter 502 and clocked inverter 504 while tri-state inverter 506 is tri-stated. Data signal D2 must be held for the period t3 to insure that the correct value of D2 is latched. Also, control signal SS must remain at logical high value for time t2 to insure that the correct value D2 is latched. Under this condition, the data written from D2 remains latched in the slave latch 108 during retention mode.

Figure 12:
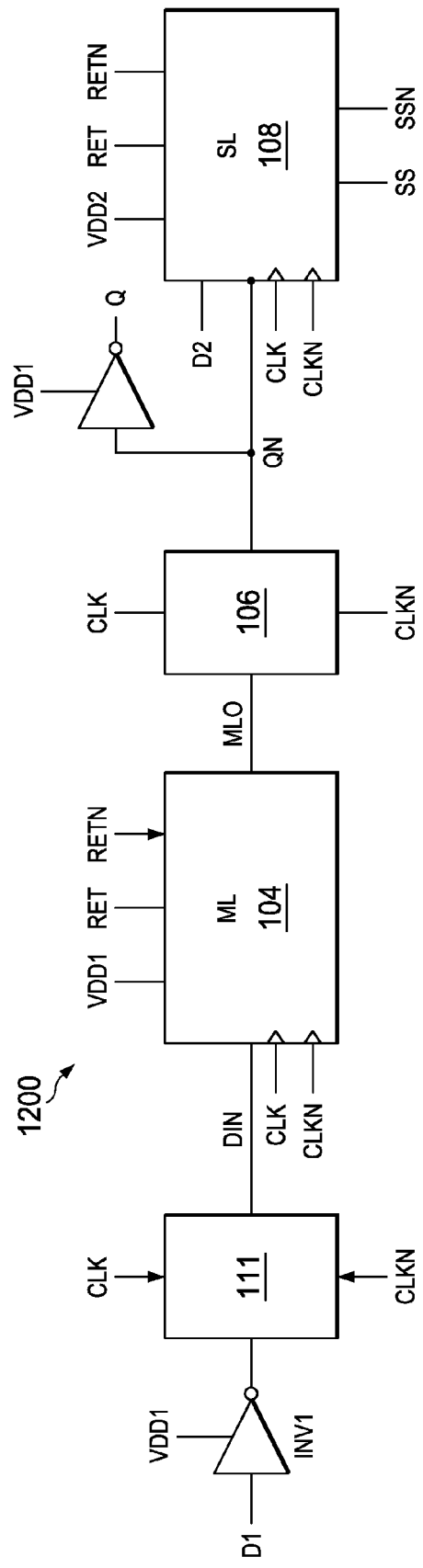
FIG. 12 is a block diagram of a positive edge flip-flop with a dual-port slave latch according to an embodiment of the invention.

FIG. 12 is a block diagram of a positive edge flip-flop 1200 with a dual-port slave latch 108 according to an embodiment of the invention. In this embodiment, the positive edge flip-flop is not scan-able for test purposes. Rather than having a 2-to-1 multiplexer as shown in FIG. 1, this embodiment of the invention uses an inverter INV1 to drive the complementry logical value of D1 through a pass gate 111 into the master latch 104. The control signals to pass gate 111 are CLK and CLKN. The pass gate 111 transmits the logic value on DIN into the master latch 104 when CLK=0 and CLKN=1 and blocks data transfer when CLK=1 and CLKN=0. The rest of the flip-flop functions as previously described for FIG. 1.

Inverters internal to the flip-flops 100 and 1200 may be used in an embodiment of the invention to invert signals CLK, SE, RET and SS.

The foregoing description has been presented for purposes of illustration and description. It is not intended to be exhaustive or to limit the invention to the precise form disclosed, and other modifications and variations may be possible in light of the above teachings. The embodiments were chosen and described in order to best explain the applicable principles and their practical application to thereby enable others skilled in the art to best utilize various embodiments and various modifications as are suited to the particular use contemplated. It is intended that the appended claims be construed to include other alternative embodiments except insofar as limited by the prior art.

What is claimed is:

1. A flip-flop circuit comprising:
   a multiplexer configured to receive a first data bit, a scan data bit, a scan enable control signal and a binary logical compliment signal of the scan enable control signal, wherein the scan enable control signal and the binary logical compliment signal of the scan enable control signal determine whether a data output of the multiplexer is the binary compliment of the first data bit or the binary compliment of scan data bit;
   a master latch configured to receive the data output of the multiplexer, a clock signal, a binary logical compliment signal of the clock signal, a retain control signal and a binary logical compliment signal of the retain control signal, wherein the clock signal, the binary logical compliment signal of the clock signal, the retain control signal and the binary logical compliment signal of the retain control signal determine when the binary logical value of the data output of the multiplexer is presented on the output of the master latch and when the output of the master latch is latched in the master latch;
   a transfer gate wherein the transfer gate transfers data from the output of the master latch to the output of the transfer gate when the clock signal transitions from a low logical value to a logical high value;
   a slave latch configured to receive the output of the transfer gate, a second data bit, the clock signal, the binary logical compliment signal of the clock signal, the retain control signal, the binary logical compliment signal of the retain control signal, a slave control signal and a binary logical compliment signal of the slave control signal wherein the clock signal, the binary logical compliment signal of the clock signal, the retain control signal, the binary logical compliment signal of the retain control signal, the slave control signal and the binary logical compliment signal of the slave control signal determine whether the output of the transfer gate or the second data bit (D2) is latched in the slave latch.

2. The flip-flop circuit of claim 1, further comprising a first inverter wherein the first inverter receives the output from the slave latch and the first inverter outputs a binary logical compliment of the output from the slave latch.

3. The flip-flop circuit of claim 1, further comprising a buffer wherein the buffer receives the output from the slave latch and the buffer outputs the same logical value as the output of the slave latch.

4. The flip-flop circuit of claim 1 wherein the multiplexer and the master latch receives power from a first power supply; wherein the slave latch receives power from a second power supply.

5. The flip-flop of claim 4 wherein the first power supply is turned off and the second power supply is turned on during operation of a retention mode; wherein power is only supplied to the slave latch.

6. The flip-flop of claim 1 wherein the retain control signal, the binary logical compliment signal of the retain control signal, the slave control signal and the binary logical compliment signal of the slave control signal are controlled external to the flip-flop to prevent data contention between the output of the transfer gate and the second data bit.

7. The flip-flop of claim 1 wherein the master latch comprises:
   a first clocked inverter, the first clocked inverter having a data input, two control inputs and a data output wherein the data input of the first clocked inverter is electrically connected to the data output of the multiplexer, the first control input of the first clocked inverter is electrically connected to the clock signal, and the second control input of the first clocked inverter is connected to the binary logical compliment signal of the clock signal;
   a tri-state inverter, the tri-state inverter having a data input, two control inputs and a data output wherein the data input of the tri-state inverter is electrically connected to the data output of the first clocked inverter, the first control input of the tri-state inverter is electrically connected to the retain control signal, and the second control input of the tri-state inverter is connected to the binary logical compliment signal of the retain control signal;
   a second clocked inverter, the second clocked inverter having a data input, two control inputs and a data output wherein the data input of the second clocked inverter is electrically connected to the data output of the tri-state inverter, the first control input of the second clocked inverter is electrically connected to the clock signal, the second control input of the second clocked inverter is connected to the binary logical compliment signal of the clock signal and the output of the second clocked inverter is electrically connected to the output of the first clocked inverter and to the input of the tri-state inverter.

8. The flip-flop of claim 1 wherein the transfer gate comprises:
- an NMOS transistor having a gate, drain and source wherein the gate of the NMOS transistor is electrically connected to the clock signal;
- a PMOS transistor having a gate, drain and source wherein the gate of the PMOS transistor is electrically connected to the binary logical compliment signal of the clock signal, the drains of the NMOS and PMOS transistors are electrically connected and the sources of the NMOS and PMOS transistors are electrically connected.

9. The flip-flop of claim 1 wherein the slave latch comprises:
- a first tri-state inverter, the first tri-state inverter having a data input, two control inputs and a data output wherein the data input of the first tri-state inverter is electrically connected to the output of the transfer gate, the first control input of the first tri-state inverter is electrically connected to the slave control signal, and the second control input of the first tri-state inverter is connected to the binary logical compliment signal of the slave control signal;
- a second tri-state inverter, the second tri-state inverter having a data input, two control inputs and a data output wherein the data input of the second tri-state inverter is electrically connected to the second data bit, the first control input of the second tri-state inverter is electrically connected to the slave control signal, and the second control input of the second tri-state inverter is connected to the binary logical compliment signal of the slave control signal and the outputs of the first and second tri-state inverter are electrically connected to each other;
- a clocked inverter, the clocked inverter having a data input, four control inputs and a data output wherein the data input of the clocked inverter is electrically connected to the data output of the first and second tri-state inverters, a first control input of the clocked inverter is electrically connected to the clock signal, a second control input of the clocked inverter is connected to the binary logical compliment signal of the clock signal, a third control input of the clocked inverter is electrically connected to the retain control signal, a fourth control input of the clocked inverter is electrically connected to the binary logical compliment signal of the retain control signal and the output of the clocked inverter is electrically connected to the input of the first tri-state inverter.

10. The flip-flop circuit of claim 1, further comprising a second inverter wherein the second inverter receives the clock signal and the second inverter outputs the binary logical compliment signal of the clock signal.

11. The flip-flop circuit of claim 1, further comprising a third inverter wherein the third inverter receives the retain control signal and the third inverter outputs the binary logical compliment signal of the retain control signal.

12. The flip-flop circuit of claim 1, further comprising a fourth inverter wherein the fourth inverter receives the slave control signal and the fourth inverter outputs the binary logical compliment signal of the slave control signal.

13. The flip-flop circuit of claim 1, further comprising a fifth inverter wherein the fifth inverter receives the scan enable control signal and the fifth inverter outputs the binary logical compliment signal of the scan enable control signal.

* * * * *